United States Patent
Mantz

(10) Patent No.: US 8,622,451 B2
(45) Date of Patent: *Jan. 7, 2014

(54) ENDEFFECTORS FOR HANDLING SEMICONDUCTOR WAFERS

(75) Inventor: Paul Mantz, Ehingen-Donau (DE)

(73) Assignee: Mattson Technology, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/356,820

(22) Filed: Jan. 24, 2012

(65) Prior Publication Data

US 2012/0126555 A1    May 24, 2012

Related U.S. Application Data

(62) Division of application No. 12/640,135, filed on Dec. 17, 2009, now Pat. No. 8,109,549, which is a division of application No. 10/781,323, filed on Feb. 18, 2004, now Pat. No. 7,654,596.

(60) Provisional application No. 60/483,425, filed on Jun. 27, 2003.

(51) Int. Cl.
   *B65G 49/07*   (2006.01)
   *B66C 1/02*    (2006.01)

(52) U.S. Cl.
   USPC ........... 294/103.1; 294/213; 414/941; 901/39

(58) Field of Classification Search
   USPC ........ 294/103.1, 27.1, 32, 213, 902; 414/941, 414/222.01, 752.1, 744.8; 901/30, 31
   See application file for complete search history.

(56) References Cited

U.S. PATENT DOCUMENTS

| 4,024,944 A | 5/1977 | Adams et al. |
| 4,566,726 A | 1/1986 | Correnti et al. |
| 4,900,214 A | 2/1990 | Ben |

(Continued)

FOREIGN PATENT DOCUMENTS

| WO | WO 9419821 A1 | 9/1994 |
| WO | WO 9443021 A1 | 8/1999 |

(Continued)

OTHER PUBLICATIONS

Technical Bulletin from Festo AG & Co. for DFC-4-10-P-GF 189452, 5 pages.

(Continued)

*Primary Examiner* — Paul T Chin
(74) *Attorney, Agent, or Firm* — Dority & Manning, P.A.

(57) ABSTRACT

An endeffector for handling wafers at a relatively low temperature is disclosed along with an endeffector for handling wafers at a relatively high temperature. Both endeffectors include a base member and uniquely designed support members that are configured to only contact a wafer at the wafer's edge. Further, the support members have an arcuate shape that generally matches a radius of a semiconductor wafer. More specifically, each support member has a curved wafer contact surface that tapers from a maximum radius at a top surface to a minimum radius at a bottom surface. The endeffectors may also include a wafer detection system. The endeffector for handling wafers at relatively low temperatures may also include a pushing device that is used not only to position a wafer but to hold a wafer on the endeffector during acceleration or deceleration of the endeffector caused by a robot arm attached to the endeffector.

15 Claims, 16 Drawing Sheets

(56) References Cited

U.S. PATENT DOCUMENTS

| | | | | |
|---|---|---|---|---|
| 4,944,650 | A | 7/1990 | Matsumoto | |
| 5,022,695 | A | 6/1991 | Ayers | |
| 5,133,635 | A | 7/1992 | Malin et al. | |
| 5,238,354 | A | 8/1993 | Volovich | |
| 5,364,222 | A | 11/1994 | Akimoto et al. | |
| 5,380,137 | A | 1/1995 | Wada | |
| 5,511,934 | A | 4/1996 | Bacchi et al. | |
| 5,513,948 | A | 5/1996 | Bacchi et al. | |
| 5,643,366 | A | 7/1997 | Somekh et al. | |
| 5,647,626 | A * | 7/1997 | Chen et al. | 294/87.1 |
| 5,746,460 | A | 5/1998 | Marohl et al. | |
| 5,810,935 | A | 9/1998 | Lee et al. | |
| 5,820,942 | A | 10/1998 | Singh et al. | |
| 5,870,488 | A | 2/1999 | Rush et al. | |
| 5,874,711 | A | 2/1999 | Champetier et al. | |
| 5,930,456 | A | 7/1999 | Vosen | |
| 5,960,158 | A | 9/1999 | Gat et al. | |
| 5,970,214 | A | 10/1999 | Gat | |
| 5,970,382 | A | 10/1999 | Shah | |
| 5,980,187 | A | 11/1999 | Verhovsky | |
| 5,980,188 | A | 11/1999 | Ko et al. | |
| 5,980,194 | A | 11/1999 | Freerks et al. | |
| 5,980,637 | A | 11/1999 | Singh et al. | |
| 5,997,175 | A | 12/1999 | Champetier et al. | |
| 6,027,244 | A | 2/2000 | Champetier et al. | |
| 6,034,357 | A | 3/2000 | Guardado | |
| 6,056,434 | A | 5/2000 | Champetier | |
| 6,075,922 | A | 6/2000 | Tay et al. | |
| 6,095,582 | A | 8/2000 | Siniaguine et al. | |
| 6,098,484 | A | 8/2000 | Bacchi et al. | |
| 6,109,677 | A | 8/2000 | Anthony | |
| 6,116,848 | A | 9/2000 | Thomas et al. | |
| 6,132,160 | A | 10/2000 | Iwai | |
| 6,160,242 | A | 12/2000 | Guardado | |
| 6,174,651 | B1 | 1/2001 | Thakur | |
| 6,200,023 | B1 | 3/2001 | Tay et al. | |
| 6,204,484 | B1 | 3/2001 | Tay et al. | |
| 6,210,484 | B1 | 4/2001 | Hathaway | |
| 6,222,990 | B1 | 4/2001 | Guardado et al. | |
| 6,256,555 | B1 | 7/2001 | Bacchi et al. | |
| 6,267,423 | B1 | 7/2001 | Marohl et al. | |
| 6,275,748 | B1 | 8/2001 | Bacchi et al. | |
| 6,281,141 | B1 | 8/2001 | Das et al. | |
| 6,283,701 | B1 | 9/2001 | Sudar et al. | |
| 6,293,696 | B1 | 9/2001 | Guardado | |
| 6,293,749 | B1 | 9/2001 | Raaijmakers et al. | |
| 6,298,280 | B1 | 10/2001 | Bonora et al. | |
| 6,305,898 | B1 * | 10/2001 | Yamagishi et al. | 414/744.5 |
| 6,310,328 | B1 | 10/2001 | Gat | |
| 6,322,116 | B1 | 11/2001 | Stevens | |
| 6,322,119 | B1 | 11/2001 | Schmidt et al. | |
| 6,359,263 | B2 | 3/2002 | Tay et al. | |
| 6,403,923 | B1 | 6/2002 | Tay et al. | |
| 6,409,453 | B1 * | 6/2002 | Brodine et al. | 414/416.01 |
| 6,438,460 | B1 | 8/2002 | Bacchi et al. | |
| 6,453,214 | B1 | 9/2002 | Bacchi et al. | |
| 6,514,876 | B1 | 2/2003 | Thakur et al. | |
| 6,559,424 | B2 | 5/2003 | O'Carroll et al. | |
| 6,610,967 | B2 | 8/2003 | Gat | |
| 6,638,876 | B2 | 10/2003 | Levy et al. | |
| 6,678,581 | B2 * | 1/2004 | Hung et al. | 700/245 |
| 6,688,662 | B2 | 2/2004 | Casarotti et al. | |
| 6,692,219 | B2 * | 2/2004 | Coomer et al. | 414/754 |
| 6,717,158 | B1 | 4/2004 | Gat et al. | |
| 6,727,474 | B2 | 4/2004 | Gat | |
| 6,817,640 | B2 * | 11/2004 | Menon et al. | 294/103.1 |
| 7,004,716 | B2 | 2/2006 | Graf et al. | |
| 7,654,596 | B2 | 2/2010 | Mantz | |
| 2002/0015636 | A1 | 2/2002 | Lee et al. | |
| 2002/0017618 | A1 | 2/2002 | Gat et al. | |
| 2002/0104619 | A1 | 8/2002 | Koren et al. | |
| 2002/0137311 | A1 | 9/2002 | Timans | |
| 2002/0172585 | A1 | 11/2002 | Graft et al. | |
| 2003/0031793 | A1 | 2/2003 | Chang et al. | |
| 2003/0052497 | A1 | 3/2003 | Holbrooks | |
| 2003/0053902 | A1 | 3/2003 | Yokota et al. | |
| 2003/0085582 | A1 * | 5/2003 | Woodruff et al. | 294/103.1 |
| 2003/0124820 | A1 | 7/2003 | Johnsgard et al. | |
| 2003/0209326 | A1 | 11/2003 | Lee et al. | |
| 2003/0235983 | A1 | 12/2003 | Li et al. | |
| 2003/0236642 | A1 | 12/2003 | Timans | |
| 2004/0018008 | A1 | 1/2004 | Koren et al. | |
| 2004/0025787 | A1 | 2/2004 | Selbrede et al. | |
| 2004/0035847 | A1 | 2/2004 | Gat | |
| 2004/0058557 | A1 | 3/2004 | Eisele et al. | |
| 2004/0084437 | A1 | 5/2004 | Timans | |

FOREIGN PATENT DOCUMENTS

| | | |
|---|---|---|
| WO | WO 0003418 A2 | 1/2000 |
| WO | WO 0003418 A3 | 1/2000 |
| WO | WO 0145501 A2 | 6/2001 |
| WO | WO 0145501 A3 | 6/2001 |

OTHER PUBLICATIONS

Communication Relating to the Results of the partial International Search for PCT/US2004/008767 dated Apr. 22, 2005.

* cited by examiner

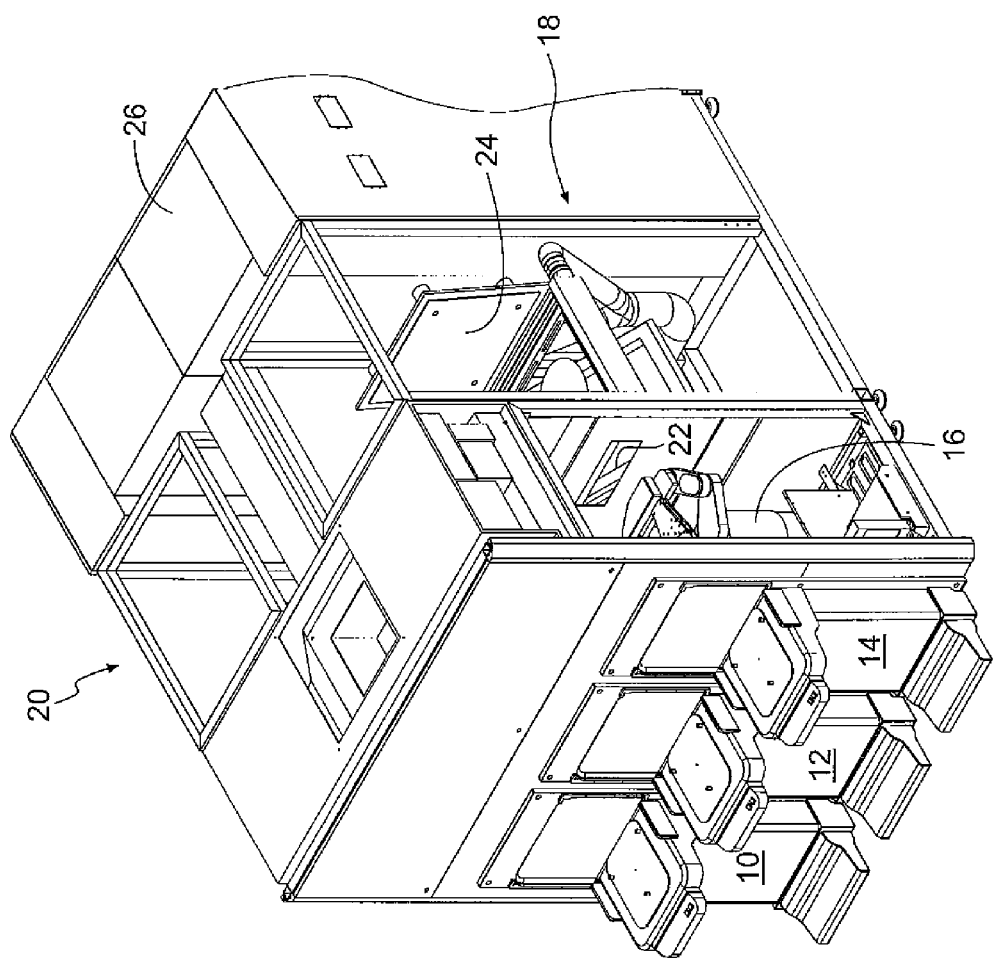

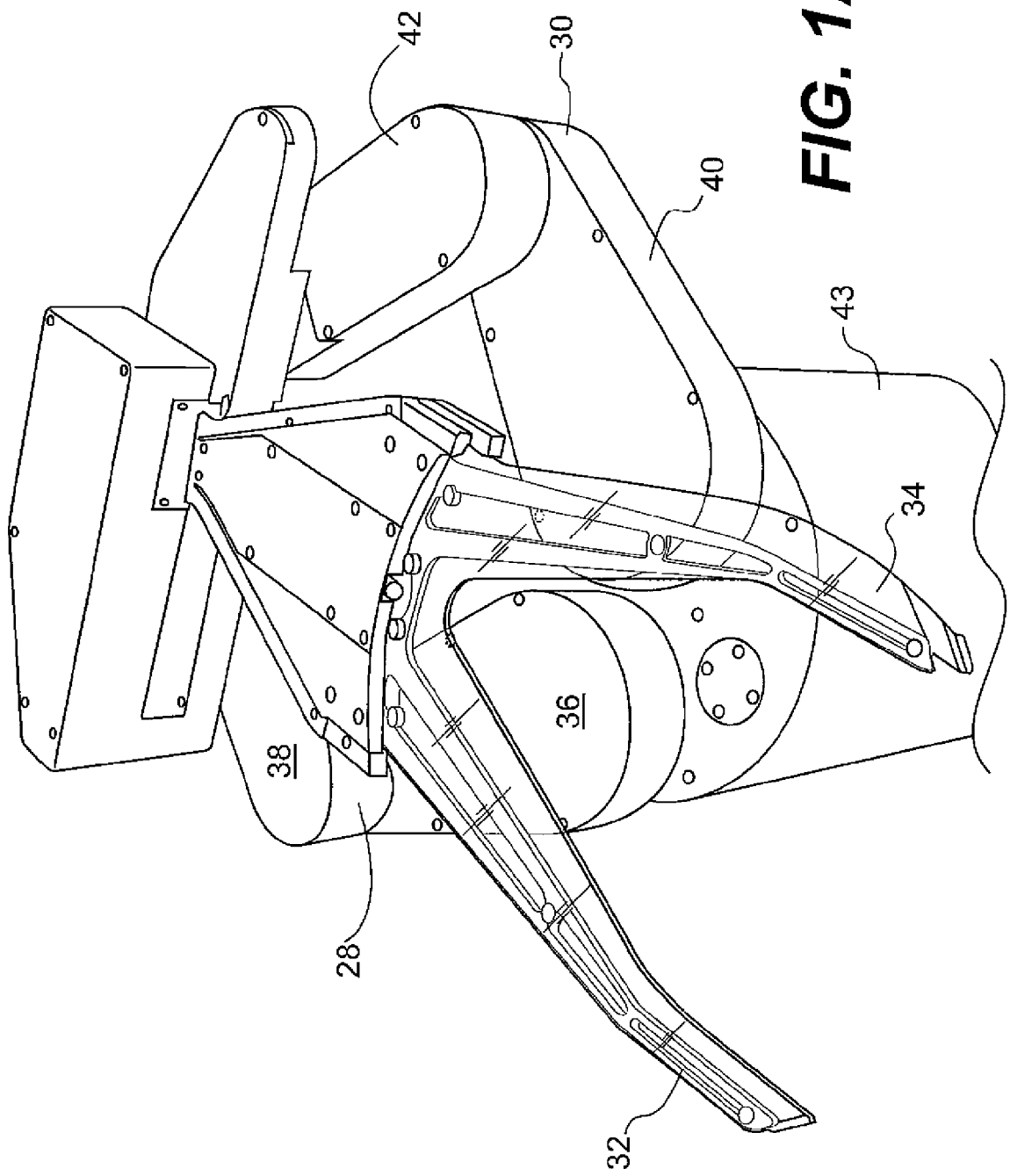

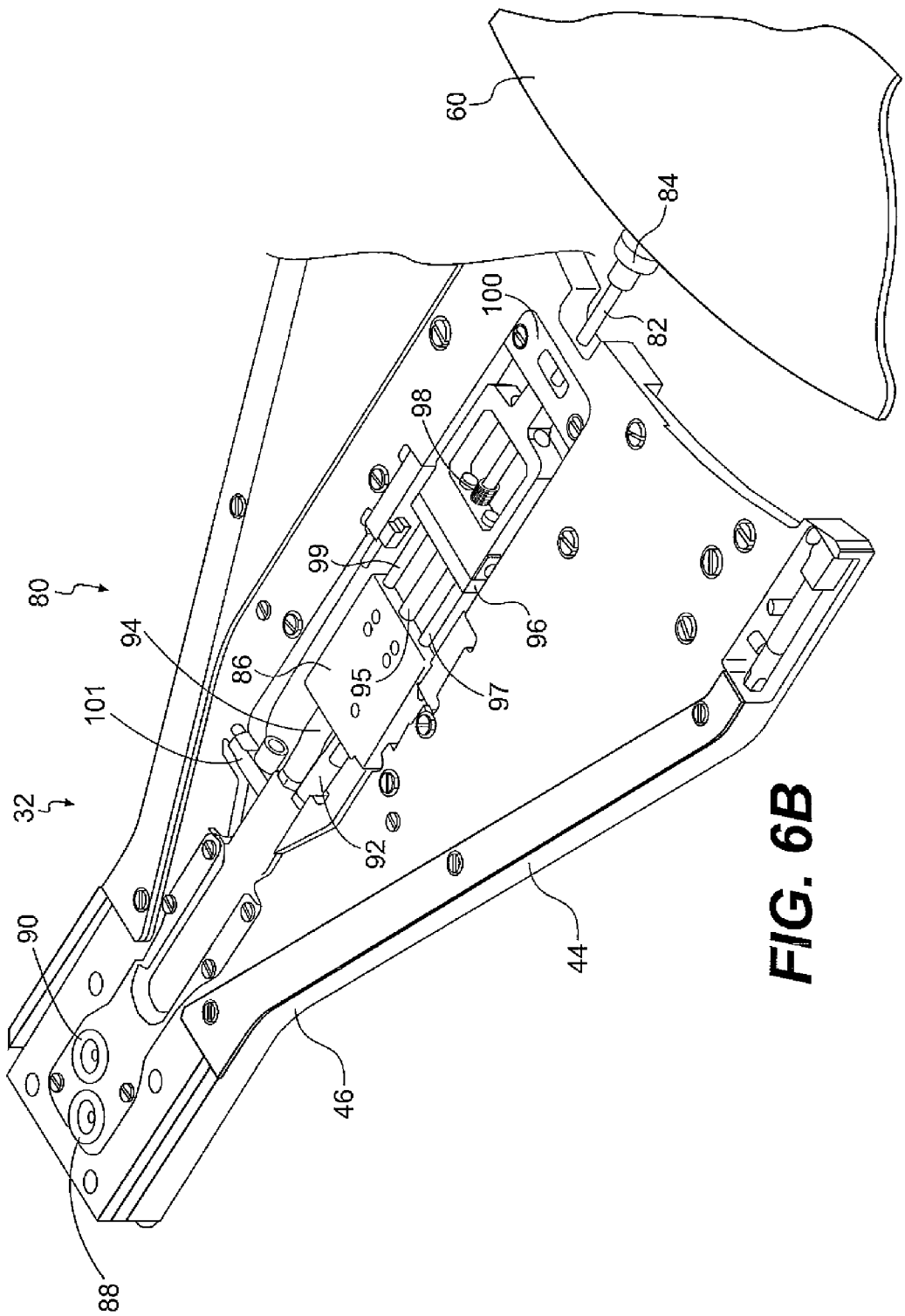

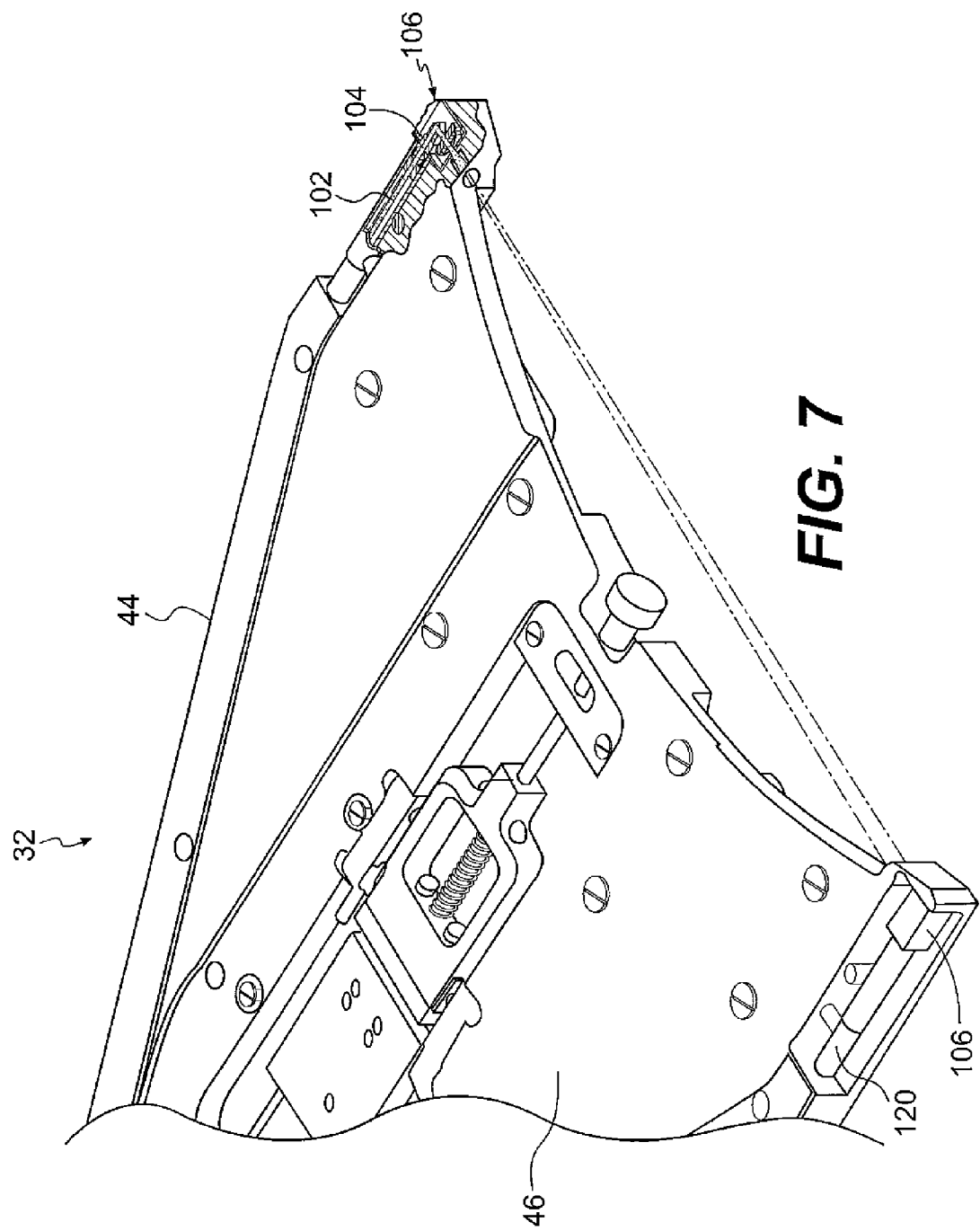

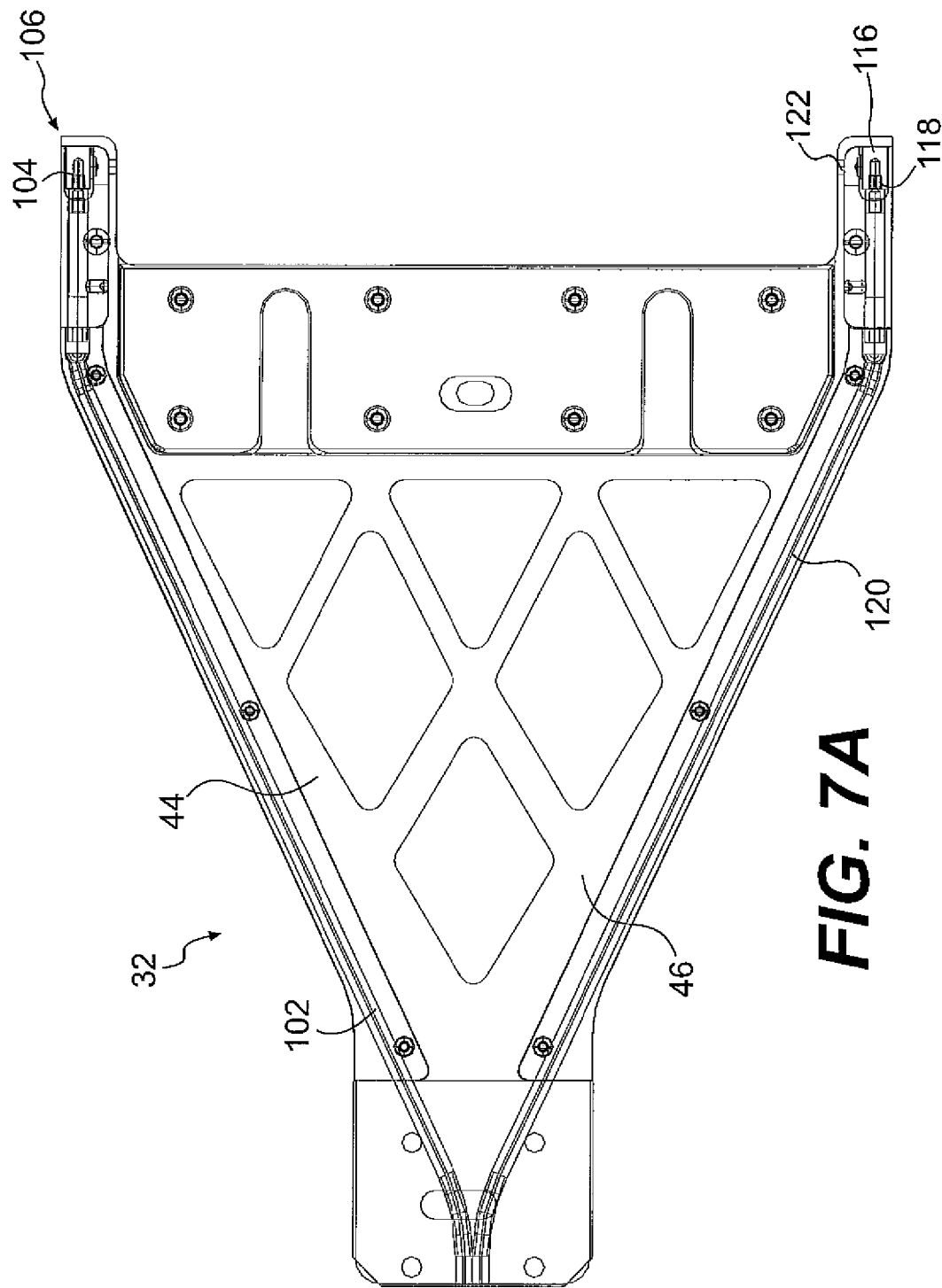

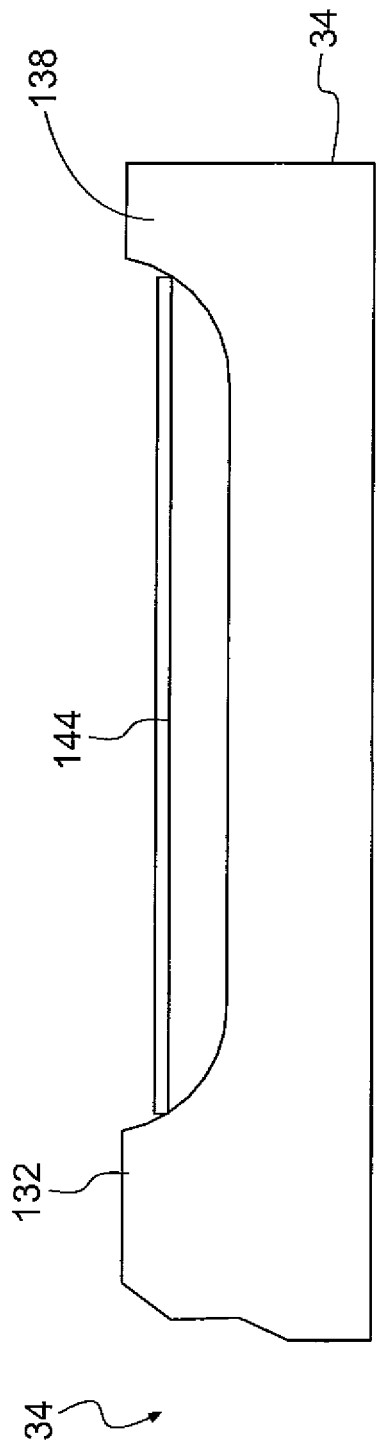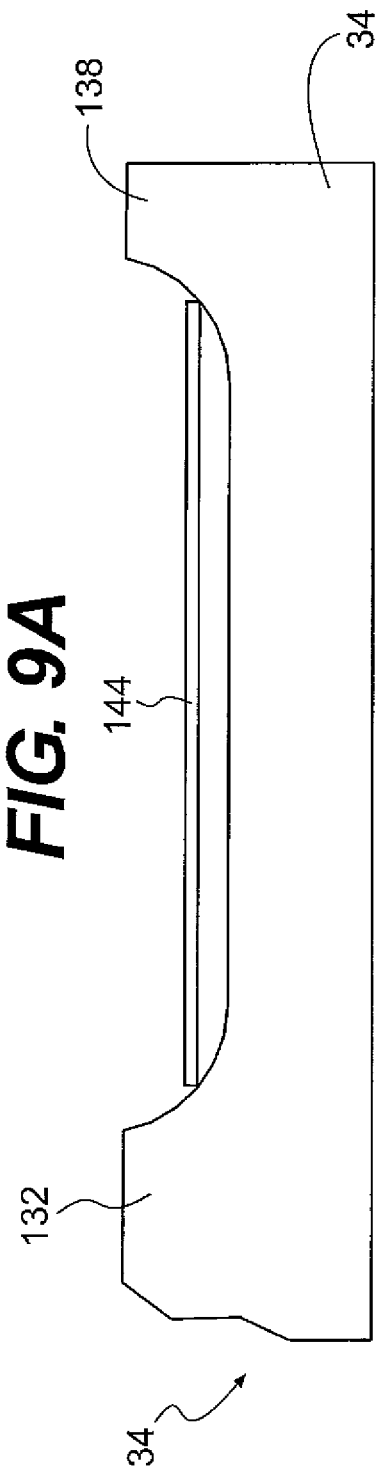

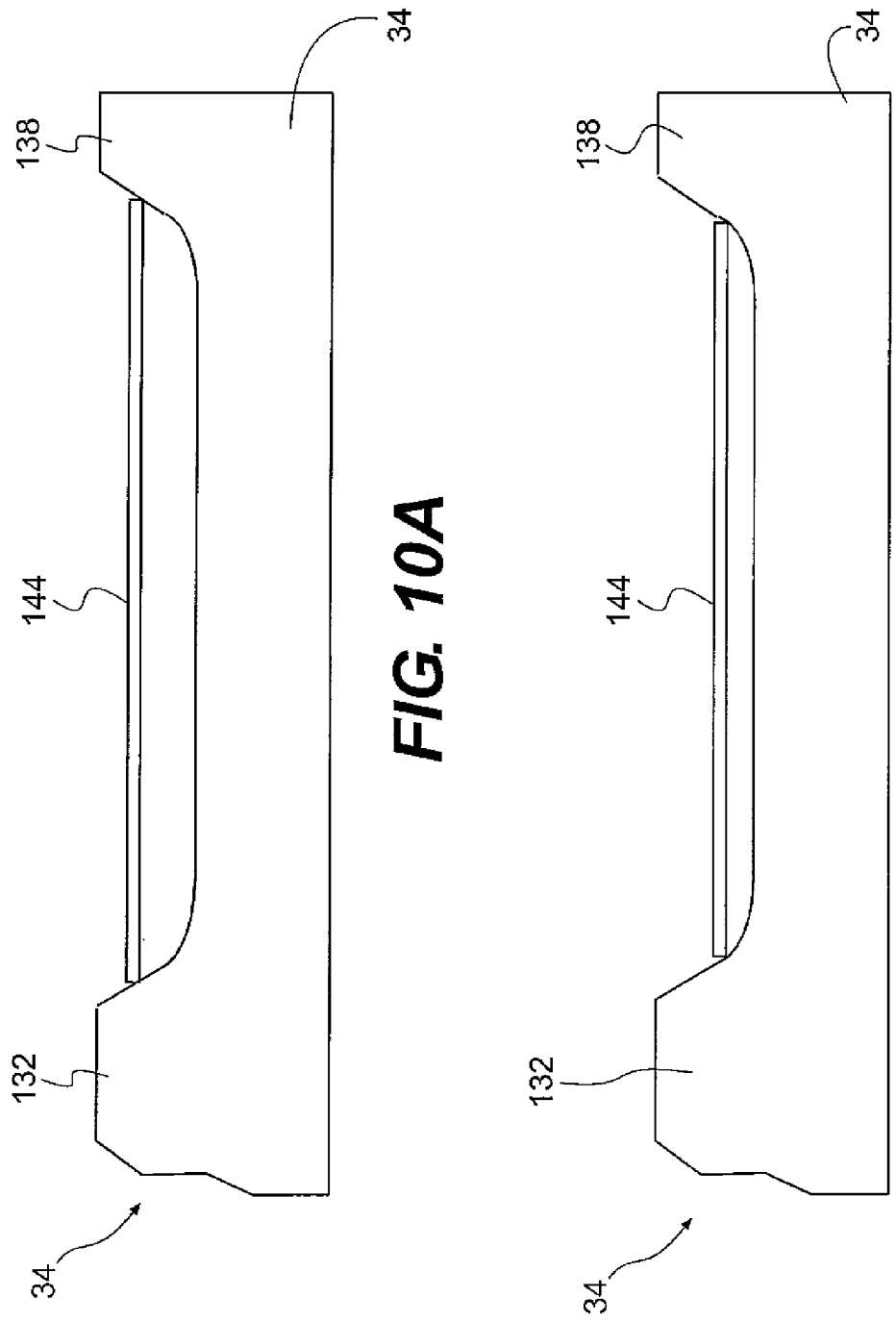

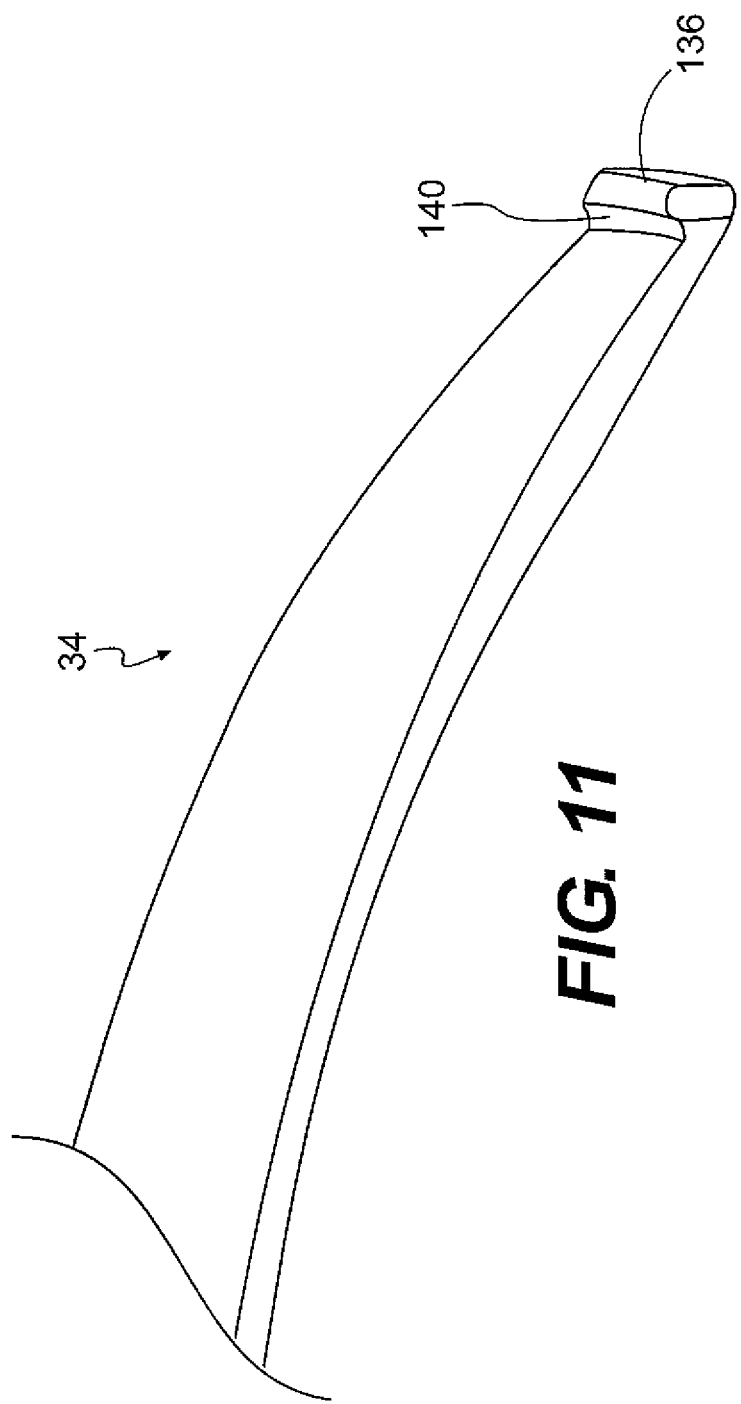

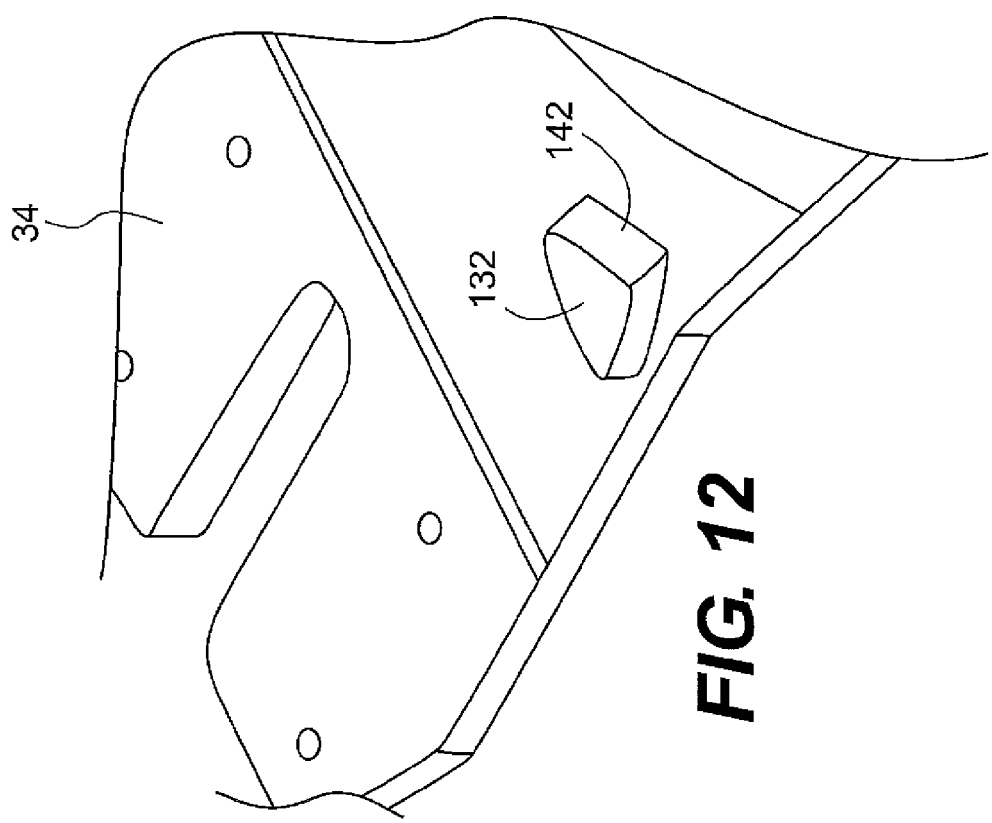

ENDEFFECTORS FOR HANDLING SEMICONDUCTOR WAFERS

PRIORITY CLAIMS

The present application is a divisional of and claims priority to U.S. patent application Ser. No. 12/640,135 filed on Dec. 17, 2009 which claims the benefit of U.S. patent application Ser. No. 10/781,323 filed on Feb. 18, 2004, which claims the benefit of U.S. Provisional Application No. 60/1483,425, filed Jun. 27, 2003. U.S. patent application Ser. Nos. 12/640,135 ,10/781,323 and U.S. Provisional Application No. 60/483,425 are incorporated herein by reference for all purposes.

BACKGROUND OF THE INVENTION

In general, an integrated circuit refers to an electrical circuit contained on a single monolithic chip containing active and passive circuit elements. Integrated circuits are fabricated by diffusing and depositing successive layers of various materials in a preselected pattern on a substrate. The materials can include semiconductive materials such as silicon, conductive materials such as metals, and low dielectric materials such as silicon dioxide. The semiconductive materials contained in integrated circuit chips are used to form almost all of the ordinary electronic circuit elements, such as resistors, capacitors, diodes, and transistors.

Typically, the substrate that is used to form integrated circuit chips is made from a thin slice or wafer of silicon. During production of integrated circuit chips, the semiconductor wafers are typically kept in carriers called cassettes. The wafers are separated from one another in the cassettes in a stacked arrangement. The wafers are transported in and out of the cassettes individually using wafer handling devices, which are also known as endeffectors. The endeffectors may be attached to a robot arm which moves the endeffectors in one, two or three directions.

The endeffectors are designed to enter the cassette in between a pair of adjacent wafers and to pick up one of the wafers for transfer into, for instance, a processing chamber. In the processing chamber, the semiconductor wafer is subjected to one of various processes. For instance, in the processing chamber, a chemical vapor deposition process, an etching process, an annealing process, and/or an epitaxial growth process may occur.

During the transport of wafers, care must be taken to ensure that the wafers are not damaged or contaminated. Thus, there have been many efforts in the industry to design endeffectors and robot arms that are capable of carefully transporting wafers in a very precise manner. Although many improvements have been made in the area of wafer handling, however, further improvements are still needed. For example, many wafer handling tools are relatively large and bulky in order to accommodate many of the instruments that are now attached to the tools in order to more precisely transport wafers. The size of the endeffectors, however, limit the speed at which the endeffectors are transported and accelerated. Further, relatively large endeffectors require that the processing chamber contain relatively large openings for receiving the endeffectors and the wafers carried thereon.

In view of the above, a need currently exists for further improvements in the design of endeffectors and robot arms. Further, a need exists for a relatively slim product design that not only ensures accurate wafer control but that can integrate a wafer detection system and a wafer pushing mechanism that may be used to grip wafers during transportation. A need further exists for a relatively slim endeffector design that may be used when handling cold wafers or when handling hot wafers.

SUMMARY OF THE INVENTION

The present invention recognizes various drawbacks and disadvantages of prior art endeffector designs. In general, therefore, the present invention is directed to various endeffectors having many distinct advantages and benefits not before realized.

In one embodiment, for instance, the present invention is directed to an endeffector for handling semiconductor wafers. The endeffector includes a base member having a proximal end and a distal end. In one embodiment, for instance, the base member may include a first tine spaced from a second tine in a forked arrangement. The first and second tines may terminate at the distal end of the base member. A plurality of support members may be located on the base member for contacting and supporting a wafer placed on the endeffector. The support members can take on various forms and shapes depending upon the particular application. In one embodiment, the support members may be configured only to contact a wafer at its edge. As used herein, an edge of a wafer refers to the boundary area of a wafer separated between the top surface and the bottom surface of the wafer. In the past, for instance, many endeffectors supported a wafer along the periphery of the wafer, which is part of the bottom surface of the wafer.

In accordance with one embodiment of the present invention, the endeffector has a relatively slim profile. For example, the endeffector can have a maximum profile height of less than about 12 mm, such as less than about 10 mm.

In one embodiment, the endeffector can further include a pushing device for positioning a wafer on the base member. The pushing device can comprise a retractable piston configured to contact an edge of a semiconductor wafer. The piston can be movable between an extended position and a retracted position.

A biasing member may be placed in operative association with the piston. The biasing member, which may be, for instance, a spring, can bias the piston towards its retracted position.

In order to extend the piston for contacting a wafer, the endeffector can further include a pneumatic actuator. The pneumatic actuator can be configured to receive a pressurized gas that is used to overcome the force being applied to the piston by the biasing member and move the piston from the retracted position to an extended position. The pneumatic actuator, in one embodiment, can be connected to a pair of gas lines. The gas lines may be configured to feed pressurized gases into the pneumatic actuator. The force of the gases may be used to move a driving member into and out of the pneumatic actuator. The driving member may be then connected to the piston for extending and retracting the piston into a desired position.

When containing the pushing device, the endeffector can further comprise a suction device positioned adjacent to the pneumatic actuator. The suction device can be configured to create a suction force for capturing any particles that are released during movement of the piston. For instance, in one embodiment, the suction device may be in fluid communication with one of the gas lines connected to the pneumatic actuator. A check valve may be located between the gas line and the suction device. When a suction force is applied to the gas line, the check valve may open creating a suction force within the suction device. In this manner, the suction device may be utilized when a wafer is not being clamped by the pushing device.

The endeffector of the present invention can further include a wafer detection system for detecting the presence of a wafer on the endeffector. In one embodiment, for instance, the wafer detection system can include a light sending pathway comprising a light source in communication with a light pipe and an angle optic device. A light beam can be emitted by the light source that is transmitted by the light pipe to the angle optic device. The angle optic device can be configured to redirect the light beam across a wafer receiving area on the base member defined by the support members.

A light receiver pathway may be positioned across the wafer receiving area opposite the light sending pathway for receiving a light beam emitted by the light sending pathway. The light receiver pathway can be in communication with a light sensor. The light sensor may be used to indicate the presence of a wafer when the light beam being directed across the wafer receiving area is intersected.

The angle optic device contained within the light sending pathway can include a reflecting device, such as a mirror, in combination with a convex lens that focuses and narrows the light beam. The light sending pathway can also include an optical aperture positioned in between the light pipe and the angle optic device. The aperture can have a diameter that is less than the diameter of the light pipe. For example, the aperture can have a diameter of from about 0.2 mm to about 1 mm and the light pipe can have a diameter of from about 2 mm to about 6 mm. The light pipe can be made from, for instance, a crystalline material, such as quartz.

The light receiver pathway can also comprise an angle optic device in communication with an optical aperture and a light pipe. The light receiver pathway can further include a light receiver opening facing the light sending pathway. The light receiver opening may be used to narrow the field of sight of the light receiver pathway.

In accordance with the teachings of the present invention, various different types of endeffectors may be constructed and used as desired. For example, in one embodiment, an endeffector may be made that is specifically designed for handling cold wafers having a temperature of less than about 250° C. In other embodiments, an endeffector may be designed that is configured to hold hot wafers, such as wafers having a temperature greater than about 250° C., such as up to about 750° C. In a wafer processing system, for instance, the system can include both a cold wafer endeffector and a hot wafer endeffector for transferring wafers between a processing chamber and a cassette.

Endeffectors for handling cold wafers may include a base member made from a metal, such as stainless steel. The support members contained on the base member may be made from a low friction plastic material, such as polyether-ether ketone or polyoxymethylene acetal polymer. In one embodiment, the support members can have a sloping surface for contacting the edge of a wafer. The sloping surface can have a convex and eccentrical shape. In one embodiment, for instance, the endeffector may contain four support members wherein two of the support members are located at the ends of the first and second tines. The support members located at the ends of the tines may have the convex and eccentrical shaped surface.

Endeffectors for handling hot wafers, on the other hand, can be made from a heat resistant material, such as flame polished quartz or sapphire. In this embodiment, the support members may be formed integral with the base member. The support members, for example, may have an arcuate shape that generally matches a radius of a semiconductor wafer. Each support member may have a wafer contact surface that tapers from a maximum radius to a minimum radius adjacent the base member. The difference between the maximum radius and the minimum radius may be at least about 0.75 mm, such as at least about 1 mm.

In one embodiment, the endeffector can further include emergency pins located on the base member in a center area located between the proximal end and the distal end. The emergency pins can be included on an endeffector for handling cold wafers or on an endeffector for handling hot wafers. The emergency pins generally have a height that is less than the height of the support members. For instance, the emergency pins may have a height less than about 1 millimeter.

The emergency pins are not designed to normally contact a semiconductor wafer. If a wafer contained on the endeffector, however, is bowing, the emergency pins support the wafer and prevent the wafer from contacting other parts of the endeffector. Should the wafer contact other parts of the endeffector, the wafer may become contaminated or develop temperature gradients.

Other features, aspects and advantages of the present invention are discussed in greater detail below.

BRIEF DESCRIPTION OF THE DRAWINGS

A detailed description of various embodiments of the present invention follows with reference to the following figures:

FIG. 1 is a perspective view of one embodiment of a wafer processing system made in accordance with the present invention;

FIG. 1A is a perspective view of two robot arms each attached to an endeffector made in accordance with the present invention;

FIGS. 6A and 6B are perspective views with cut away portions of an endeffector made in accordance with the present invention containing a pushing device;

FIGS. 7, 7A and 7B are various views of an endeffector made in accordance with the present invention including a wafer detection system;

FIGS. 9A, 9B, 10A and 10B are side views of different embodiments of an endeffector illustrating various support members made in accordance with the present invention;

FIG. 11 is a perspective view with cut away portions of part of the endeffector illustrated in FIG. 8; and FIG. 12 is a perspective view with cut away portions of part of the endeffector illustrated in FIG. 8.

Figure 2:
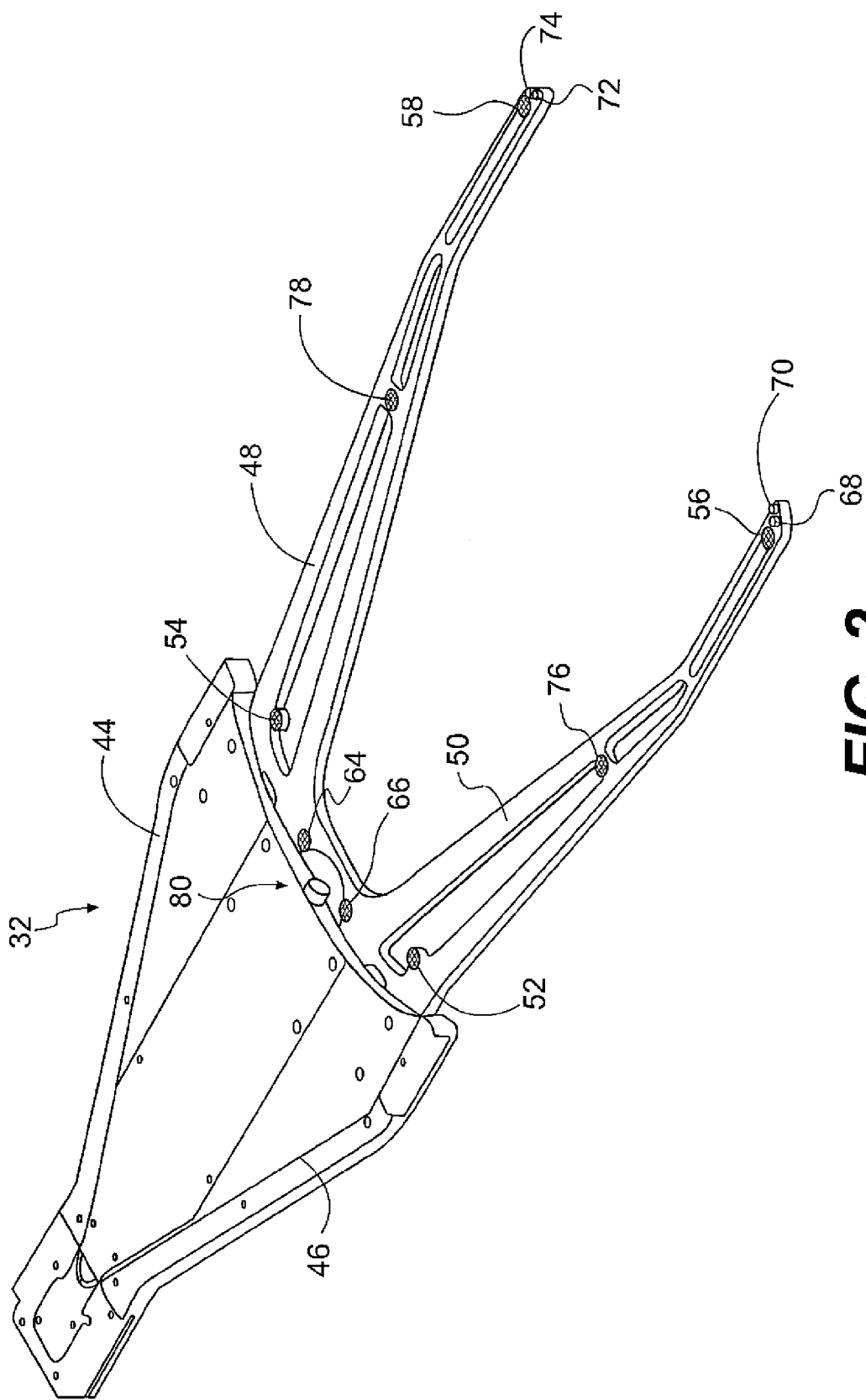
FIG. 2 is a perspective view of one embodiment of an endeffector made in accordance with the present invention.

Repeated use of reference characters in the present specification and drawings is intended to represent the same or analogous features or elements of the invention.

DETAILED DESCRIPTION

Reference now will be made to the embodiments of the invention, one or more examples of which are set forth below. Each example is provided by way of explanation of the invention, not as a limitation of the invention. In fact, it will be apparent to those skilled in the art that various modifications and variations may be made in the invention without departing from the scope or spirit of the invention. For instance, features illustrated or described as part of one embodiment may be used in another embodiment to yield a still further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied in the exemplary constructions.

In general, the present invention is directed to a wafer processing and handling system. In accordance with the present invention, various endeffectors have been designed that provide numerous improvements and advantages over many prior art constructions. In one embodiment, for instance, the present invention is directed to an endeffector that is designed to handle low temperature wafers, such as wafers having a temperature of less than about 250° C. Alternatively, the present invention is also directed to the construction of endeffectors designed to handle hot wafers, such as wafers having a temperature greater than about 250° C. It should be understood, however, that any feature included with an endeffector for handling low temperature wafers may also be used on an endeffector for handling relatively high temperature wafers.

Endeffectors made in accordance with the present invention may include specially designed support members for supporting wafers on the endeffectors. The support members are designed to only contact the wafer at its edge.

In addition to support members, the endeffectors can also include a wafer detection system. Further, the endeffectors may also include a pushing device that is used to position a wafer on the endeffector. The pushing device can also be used to clamp a wafer onto the endeffector during rapid movement of the endeffector.

Referring to FIG. 1, one embodiment of a wafer processing system made in accordance with the present invention is shown. As illustrated, the system includes a plurality of wafer cassettes 10, 12 and 14. The wafer cassettes are designed to hold the wafers in a spaced apart but stacked arrangement. Adjacent to the cassettes are one or more robotic arms 16. The robotic arms are each attached to an endeffector which is designed to remove semiconductor wafers from the cassettes 10, 12 and 14 and to place them into a wafer processing chamber 18 as shown.

In the embodiment shown in FIG. 1, the system includes a first semiconductor wafer processing chamber 18 and a second semiconductor wafer processing chamber 20 (not shown). The semiconductor wafer processing chamber 18 includes a door 22 that opens and closes for placing and removing wafers from the chamber. The wafer processing chambers may be configured to carry out various processes on semiconductor wafers. For instance, the processing chambers can be designed to carry out chemical vapor deposition, annealing, epitaxial deposition, etching, and the like. In the embodiment shown in FIG. 1, the processing chamber 18 comprises a rapid thermal processing chamber. In the embodiment illustrated in FIG. 1, a lid 24 of the processing chamber 18 is in an open position. The lid remains closed during processing but may be opened in order to, for instance, perform maintenance on the chamber.

Rapid thermal processing chamber 18 may be connected to a gas cabinet 26 which holds various gases that are used during wafer processing. For example, various gases can be fed to the chamber in order to deposit various different types of layers on a semiconductor wafer. The gases may also be inert gases used to prevent any unwanted reactions from occurring on the semiconductor wafer during heating processes.

Referring to FIG. 1A, a pair of dual robot arms 28 and 30 are shown each connected to a corresponding endeffector 32 and 34. In this embodiment, the endeffector 32 is for handling semiconductor wafers at a relatively low temperature, while the endeffector 34 is for handling semiconductor wafers at higher temperatures. By having two robot arms 28 and 30 and two endeffectors 32 and 34, the system of the present invention is capable of simultaneously handling two semiconductor wafers at the same time. For instance, endeffector 34 may be removing a semiconductor wafer from the processing chamber 24 while the endeffector 32 is removing a semiconductor wafer from a cassette for placement in one of the processing chambers.

As shown in FIG. 1A, robot arm 28 includes a first segment 36 and a second segment 38, while robot arm 30 includes a first segment 40 and a second segment 42. Through the use of the segments, the robot arms are capable of moving the endeffectors freely in two directions (X and Y directions). The endeffectors may also be moved up and down (Z direction) by including appropriate mechanisms in the robot arms. For instance, as shown in FIG. 1A, the robot arms may be connected to an elevating device 43 that elevates the arms when desired. Referring back to FIG. 1, the robot arms may also be mounted on a linear track that moves the robot arms along the cassettes and the processing chambers.

It should be understood that the robot arms shown in FIG. 1A represent just one embodiment of a mechanism for moving the endeffectors 32 and 34. In this regard, any suitable robot arm may be connected to the endeffectors. For instance, in other embodiments, the endeffectors may be connected to a robot arm that includes linear slides for moving in one, two or three directions.

Figure 3:
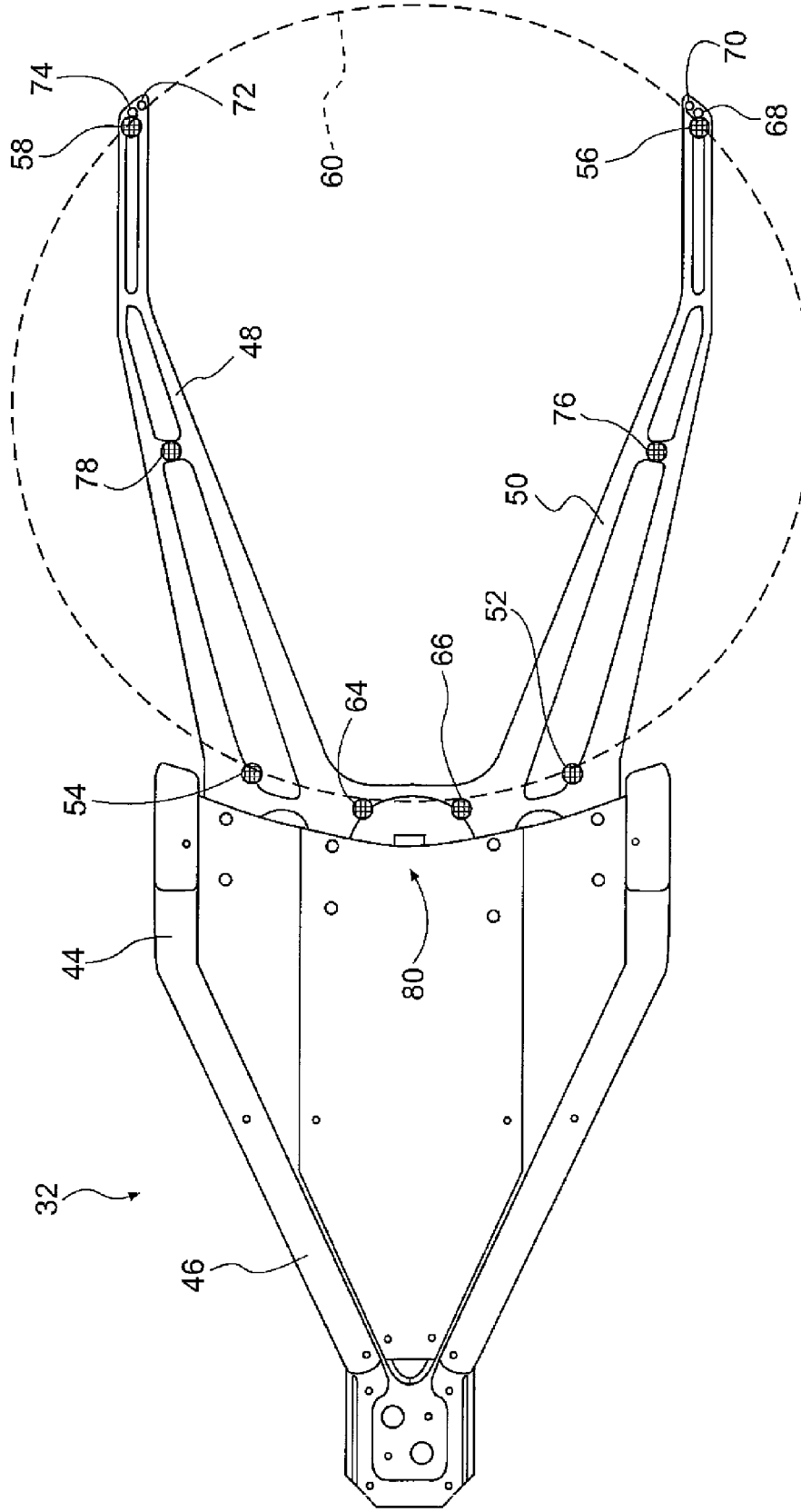
FIG. 3 is a plan view of the endeffector shown in FIG. 2.

Referring to FIGS. 2-7B, the endeffector 32 as shown in FIG. 1A will now be described in greater detail. As shown in FIGS. 2 and 3, the endeffector 32 includes a base member 44. The base member 44 includes a back portion 46 defining the proximal end of the endeffector. The base member further includes a first tine 48 and a second tine 50 that terminate at the distal end of the endeffector. When used to handle wafers having a relatively low temperature, the base member 44 can be made from a metal, such as stainless steel. Alternatively, any other suitable material may be used.

In order to support a wafer on the endeffector, the endeffector includes a plurality of support members located on the base member. In the embodiment shown in FIGS. 2 and 3, the endeffector includes four support members 52, 54, 56 and 58. As shown in FIG. 3, the support members are located on the endeffector so as to contact the edge of a semiconductor wafer 60 as shown in phantom. The support members 52, 54, 56 and 58 can be made from any suitable material with a low friction coefficient. For instance, the support members can be made from a plastic material, such as polyether-ether ketone (PEEK) or polyoxymethylene acetal polymer (POM). Alternatively, the support members can be made from a crystalline material, such as quartz or sapphire.

In order to only contact the semiconductor wafer 60 at the edge of the wafer, each of the support members may have a sloped surface.

Figure 5:
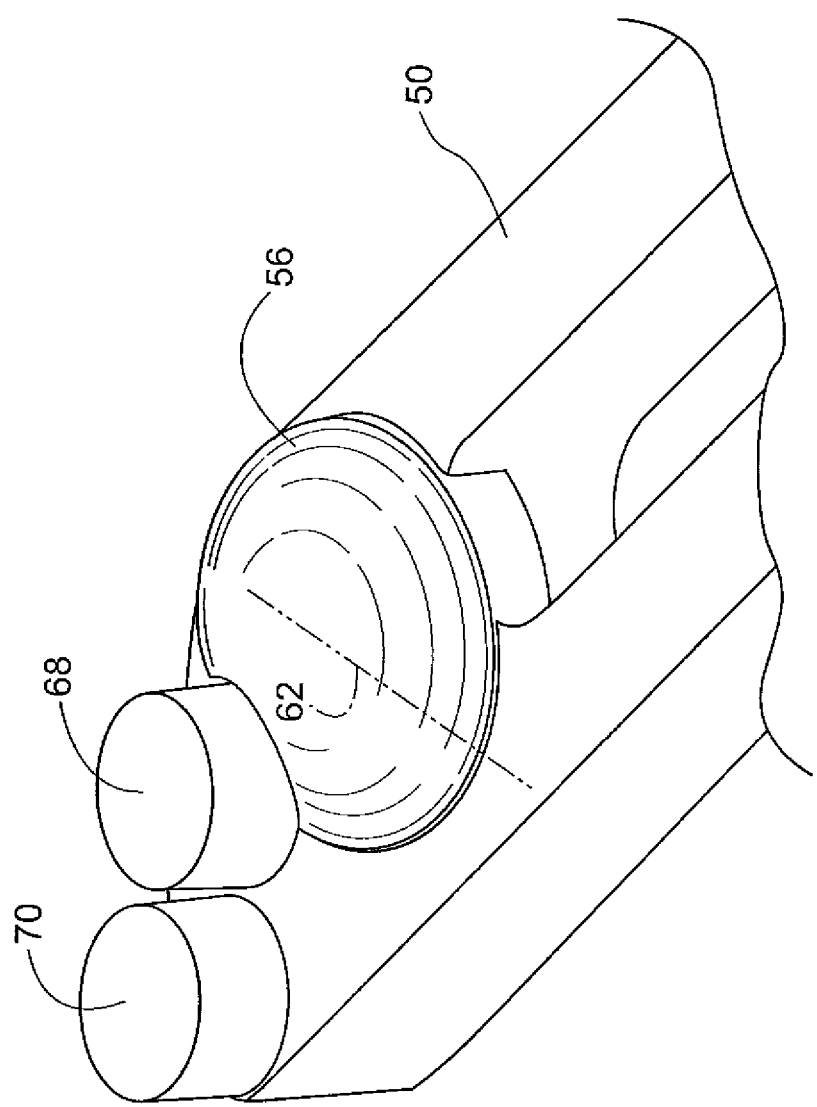
FIG. 5 is a perspective view with cut away portions of an enlarged portion of the endeffector shown in FIG. 2.

Referring to FIG. 5, for instance, one embodiment of a support member 56 made in accordance with the present invention is shown. In this embodiment, the support member 56 includes a surface that has an eccentrical and convex shape. The present inventor has discovered that the particular surface shape shown in FIG. 5 serves to better center a wafer on the support members when a wafer is loaded on the endeffector. As shown in FIG. 5, due to the support member's convex and eccentrical shape, a wafer is urged along a line 62 during centering of the wafer. This particular shape also works well in conjunction with a pushing device as will be described in more detail hereinafter.

In one embodiment, the support members 56 and 58 both have a convex and eccentrical shape. The support members 52 and 54, however, may have a convex shape that is not eccentrical. In other embodiments, the support members 52 and 54 may include any suitable sloping surface that is capable of engaging an edge of a wafer. In still other embodiments, the support members 52 and 54 may be configured to engage the wafer anywhere within the wafer edge exclusion zone.

As shown in FIG. 3, each of the support members 52, 54, 56 and 58 support the wafer 60 about its edge. The support members define a wafer receiving area therebetween. In order to maintain the wafer in the wafer receiving area, the endeffector further includes peripheral support pins 64 and 66 located at the proximal end of the endeffector and backstop members 68, 70, 72 and 74 positioned at the distal end of the endeffector. In general, the peripheral support pins and the backstop members have a height greater than the support members. For instance, the peripheral support pins and the backstop members may have a height that is at least about 0.2 mm higher than the support members, such as at least about 0.5 mm higher than the support members. The peripheral support pins 64 and 66 and the backstop members 68, 70, 72 and 74 serve to maintain the wafer 60 within the wafer receiving area during acceleration and deceleration of the endeffector 32.

As shown in FIG. 3, a pair of backstop members are each located at the end of each tine surrounding respective support members. A pair of backstop members are used because, for instance, in some embodiments the semiconductor wafer 60 may include a notch that is used to center the wafer during various processes. By using two backstop members, however, the wafer is contacted even if a notch contained in the wafer aligns with one of the backstop members. Of course, in some embodiments, only a single backstop member will be needed. Alternatively, the backstop members may have a width that is greater than the width of the notch contained in a wafer.

In accordance with the present invention, as particularly shown in FIGS. 2 and 3, the endeffector 32 further includes a pair of emergency pins 76 and 78. Emergency pins 76 and 78 are positioned on the tines of the endeffector and are generally designed not to contact the semiconductor wafer 60 when supported upon the support members. In this regard, the emergency pins 76 and 78 generally have a height lower than the height of the support members. For instance, the emergency pins 76 and 78 may have a height less than about 0.2 mm lower than the support members, such as less than about 0.5 mm. For example, in one embodiment, the emergency pins 76 and 78 have a height that is about 0.7 mm lower than the support members.

The emergency pins 76 and 78 are designed and configured to contact the semiconductor wafer 60 when the wafer is not in the correct position or is bowing. If the wafer were to contact the tines 48 and 50 of the endeffector, on the other hand, the wafer may become contaminated, especially if the tines are made from a metal.

Semiconductor wafers are currently being manufactured to have greater diameters and to be as thin as possible. As such, wafer curvature or bowing may occur, especially if the wafer has an increased temperature. The emergency pins 76 and 78 therefore provide support for a bowing wafer without the wafer incurring substantial damage.

In general, the emergency pins 76 and 78, the peripheral support pins 64 and 66, and the backstop members 68, 70, 72 and 74 can be made from a plastic or a crystalline material. In general, the emergency pins, the peripheral support pins, and the backstop members may be made from any material used to make the support members.

Figure 6A:
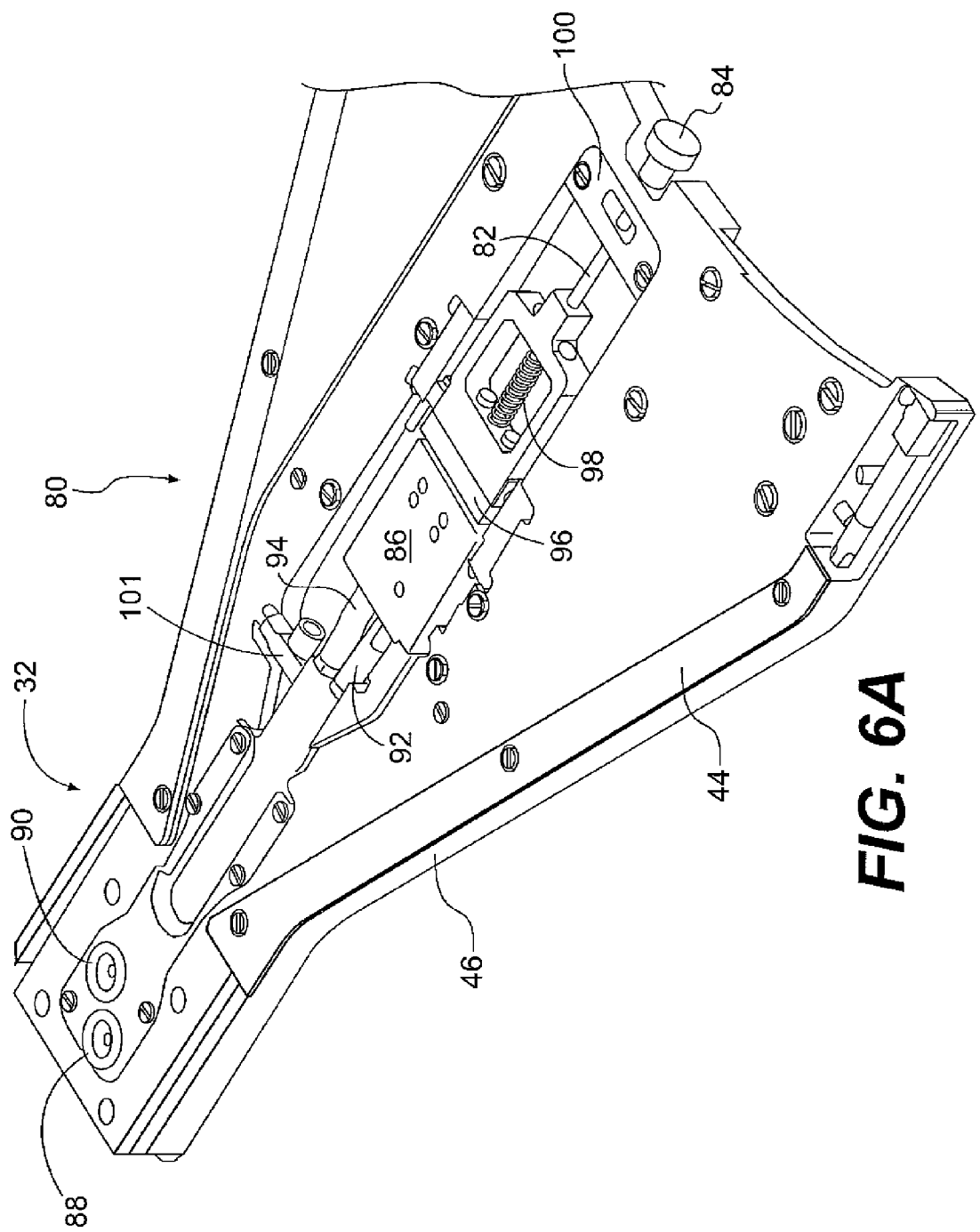

In addition to the various above described passive devices for supporting and holding a semiconductor wafer, the endeffector 32 further includes a pushing device generally 80. The pushing device 80 is contained within the base member 44 of the endeffector 32. The mechanics of the pushing device are illustrated in FIGS. 6A and 6B. In FIGS. 6A and 6B, the endeffector 32 is shown without the tines 48 and 50 being connected to the back portion 46.

As shown in FIGS. 6A and 6B, the pushing device 80 includes a piston 82 connected to a contact head 84. The contact head 84 is designed to contact the edge of a semiconductor wafer 60 as shown in FIG. 6B. The contact head may have a flat-shaped surface or a surface that is convex in shape. For most applications, it is desirable that the contact head only contact a wafer with a point-like area (punctiform) at the edge of the wafer.

The piston 82 of the pushing device 80 is connected to a pneumatic actuator 86. As shown in FIGS. 6A and 6B, the pneumatic actuator 86 is connected to a first gas line 92 and a second gas line 94. The first gas line 92 is in communication with a first gas port 88, while the second gas line 94 is in communication with a second gas port 90.

The pneumatic actuator 86 includes a driving member 96 that is connected to the piston 82. As shown in FIG. 6B, the driving member 96 includes a cylinder piston 95 and a pair of opposing guide bars 97 and 99. The cylinder piston 95 and the guide bars 97 and 99 are configured to move in and out of the pneumatic actuator 86. In particular, in order to extend the cylinder piston 95, pressurized gas is fed through the first gas port 88 and the first gas line 92. The pressurized gas forces the cylinder piston 95 out of the pneumatic actuator 86.

In order to retract the cylinder piston 95, gas flow through the first gas line 92 is stopped and a pressurized gas is fed through the second gas line 94 via the second gas port 90. For instance, the gas fed through the second gas line 94 may be routed so as to force the cylinder piston 95 back into the pneumatic actuator 86. For example, in one embodiment, the cylinder piston 95 may include a plunger (not shown) that is contacted on one side by gases being fed through the first gas line 92 and contacted on an opposite side by gases fed through the second gas line 94. In this manner, the cylinder piston 95 can be moved into and out of the pneumatic actuator 86. Thus, when extending the cylinder piston 95, gases are fed through the gas line 92 and gas line 94 is vented. When retracting the cylinder piston 95, on the other hand, gases are fed through the gas line 94 and the gas line 92 is vented. Further, when maintaining a wafer in a clamped position as shown, for instance, in FIG. 6B, a pressurized gas source is maintained within the gas line 92.

By moving the driving member 96 via the cylinder piston 95, the piston 82 is moved between a retracted position and an extended position. A retracted position is shown in FIG. 6A, while an extended position of the piston 82 is shown in FIG. 6B.

The piston 82 is further in operative association with a biasing member or spring 98. The spring 98 biases the piston so as to remain in a retracted position. The actuator device 86 overcomes the force applied to the piston by the spring causing the piston to extend. Of particular advantage, the force applied to the piston by the spring 98 increases as the piston is extended. In this manner, the amount of force exerted against a wafer by the pushing device is dampened and decreased the farther the piston is extended from a retracted position.

During movement of the piston 82, for most applications it is desirable that no particles that are created during movement of the parts be allowed to land on or in any way contaminate a semiconductor wafer contained on the endeffector 32. In this regard, the piston 82, in this embodiment, is maintained in a double bearing 100 adjacent to the contact head 84. Further, all of the moving parts of the pushing device 80 are maintained within a housing defined by the base member 44 of the endeffector 32.

In one embodiment, the endeffector 32 can further include a suction device 101 which is designed to capture any particles that may exist within the housing of the base member. For example, as shown in FIGS. 6A and 6B, a suction device 101 is positioned adjacent to the pneumatic actuator 86 and is in fluid communication with the second gas line 94 and the second gas port 90. The suction device 101 may be connected to the second gas line 94 via, for instance, a check valve. In this manner, when a vacuum is connected to the gas port 90, a suction force is created within the gas line 94 which causes the check valve to open. Once the check valve is opened, the suction device 101 creates a suction force within the housing for capturing any particles and preventing the particles from being emitted beyond the contact head 84. The suction device 101 may be operated, for instance, when pressurized gas is not needed within the second gas line 94 for operating the pneumatic actuator 86. In an alternative embodiment, however, it should be understood that a separate gas line may be connected to the suction device 101 for continuously creating a suction force within the housing of the endeffector.

The pushing device 80 can provide various and numerous functions during the handling of semiconductor wafers. For example, in one embodiment, the pushing device 80 can be used to center wafers placed on the endeffector. More particularly, the pushing device 80 can be used to push a wafer 60 into a correct position on the support members.

The pushing device 80 may also be used to clamp a wafer onto the endeffector. Actively holding a wafer on the endeffector may prevent the wafer from falling out of alignment when the endeffector is accelerated or decelerated. When used to clamp a wafer on the endeffector, the pushing device 80 may urge a semiconductor wafer 60 against the backstop members 68, 70, 72 and 74 as shown in FIGS. 2 and 3. After contacting an edge of the wafer, the pushing device may be designed, for instance, to apply from about 1 to about 3 Newtons of force against the wafer for holding the wafer in place. As described above, the spring 98 serves to dampen the amount of force applied to a wafer as the piston is extended in order to prevent damage to the wafer.

In addition to positioning a wafer on the endeffector, the pushing device 80 is also well suited to assist in removing a wafer from a cassette or from a substrate holder in a processing chamber for placing the wafer on the endeffector. For example, as the endeffector is moved into a cassette, the robot arm may be programmed so that the wafer strikes the contact head 84 of the piston 82. Once contact with the contact head 84 is made with a wafer, the piston is extended using the pneumatic actuator 86 for gripping the wafer against the backstop members. Once gripped, the endeffector and wafer may be transported with high acceleration without the fear of the wafer falling out of place. Further, during the process, the wafer is only gripped at its edge again minimizing damage to the wafer.

As described above, the piston 82 and contact head 84 of the pushing device 80 is designed such that the piston is extended when a pressurized gas is fed to a pneumatic actuator 86. In the past, endeffectors have been designed with a spring that biases a pusher towards an extended state. In these prior art constructions, a vacuum force is then used to maintain the piston in a retracted position. The present inventor, however, has discovered that by using the pneumatic actuator 86 as described above, the profile height of the endeffector can be minimized. Minimizing the height of the endeffector provides various advantages and benefits. For example, a slim endeffector is more easily maneuverable. The endeffector can enter cassettes and wafer processing chambers with minimal clearance. By using a slim endeffector, cassettes may be designed to carry greater numbers of wafers.

Similarly, processing chambers can be made having a narrower opening for the endeffector. By having a narrower opening, less contamination and temperature variation occurs when a wafer is inserted into the processing chamber using the endeffector of the present invention. Further, should the processing chamber contain harmful gases, escape of any such gases is less likely by reducing the size of the opening which receives the endeffector.

Figure 4:
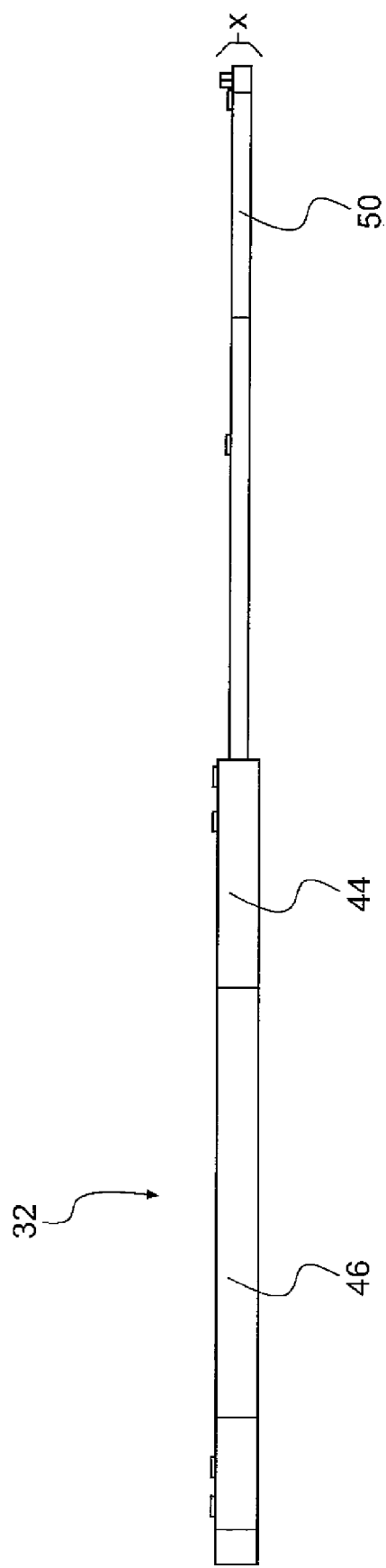
FIG. 4 is a side view of the endeffector shown in FIG. 2.

In this regard, referring to FIG. 4, a side view of the endeffector 32 is shown. Even when containing a pushing device as described above, the endeffector 32 may have a maximum profile height X of less than about 12 mm, such as less than about 10 mm. In fact, in one embodiment, it is believed that an endeffector may be made in accordance with the present invention that has a maximum profile height of less than about 8.5 mm.

Figure 7B:
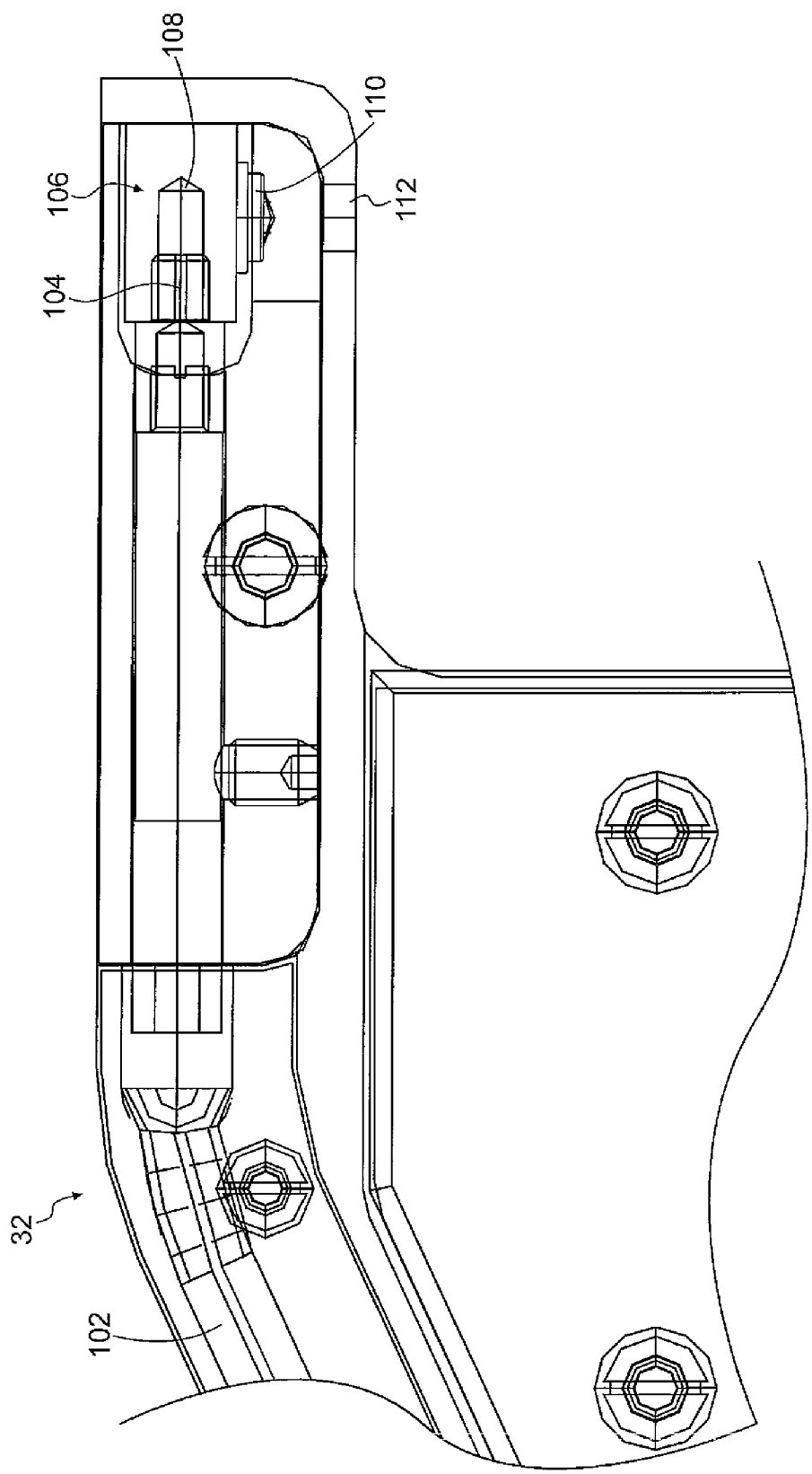

In addition to having a pushing device, endeffectors made in accordance with the present invention may also be equipped with a wafer detection system. Referring to FIGS. 7, 7A and 7B, one embodiment of a wafer detection system made in accordance with the present invention is shown. In this embodiment, the wafer detection system is shown incorporated into the endeffector 32 which is designed for handling wafers at relatively low temperatures. It should be understood, however, that the wafer detection system is equally well suited for use with endeffectors for handling wafers at higher temperatures.

In FIGS. 7, 7A and 7B, endeffector 32 is once again shown without the tines 48 and 50 being connected to the back portion 46 of the base member 44. Further, the wafer detection system is shown located at the proximal end of the endeffector. It should be understood, however, that the wafer detection system may be placed in any other suitable location within the wafer receiving area contained on the endeffector 32.

In general, the wafer detection system includes a light source that emits a light beam across the wafer receiving area of the endeffector. A receiver is positioned to receive the light beam and may comprise, for instance, a light sensor. Should the light beam be intersected, the wafer detection system indicates that a wafer is present on the endeffector.

Referring to FIG. 7A, the wafer detection system includes a light sending pathway containing a light source (not shown) in communication with a light pipe 102. The light pipe 102 is preferably made from a material capable of withstanding high temperatures. For example, in one embodiment, the light pipe 102 comprises a fiber made from a crystalline material, such as quartz. The light pipe can have any suitable diameter, such as from about 2 millimeters to about 5 millimeters. In one embodiment, for instance, the light pipe 102 can have a diameter of about 3 millimeters. As shown in FIG. 7A, the light pipe 102 extends along the outer periphery of the endeffector.

Referring to FIG. 7B, the end of the light sending pathway is shown in greater detail. As illustrated, the light pipe 102 terminates at an optical aperture 104. As shown, the optical aperture has a diameter less than the diameter of the light pipe. For example, the diameter of the optical aperture may be from about 0.1 mm to about 1.5 mm, such as having a diameter of about 0.5 mm. In general, the optical aperture 104 decreases the diameter of the light beam and has a tendency to intensify the beam.

From the optical aperture 104, the light beam is then fed through an angle optic device 106. The angle optic device may include, for instance, a reflecting device 108 in conjunction with a lens 110. The reflecting device 108 may include, for instance, a mirror that changes the direction of the light beam so that the light beam is directed across the wafer receiving area of the endeffector. It should be understood, however, that instead of a reflecting device 108, the angle optic device may include any suitable device capable of changing the direction of the light beam.

The lens 110 following the reflecting device 108 can be, for instance, a convex lens. The lens 110 is designed to focus and narrow the light beam. For example, the diameter of the light beam exiting the lens 110 can be less than about 1.5 mm, such as less than about 1.0 mm. For example, in one embodiment, the light beam exiting the lens 110 can have a diameter of about 0.5 mm.

After exiting the lens 110, the light beam shines through an orifice or light path opening 112 across the endeffector. The orifice 112 does not generally have any influence on the light beam itself.

Opposite the lens 110, the endeffector also includes a light receiver pathway as shown in FIG. 7A. In one embodiment, the light receiver pathway can have a construction very similar to the light sending pathway. For example, the light receiver pathway can include an angle optic device 116, an optical aperture 118, and a light pipe 120. The light pipe 120 may be in communication with a light sensor that is designed to sense the amount of light being received by the light receiver pathway. Should the amount of light decrease, the light sensor may be configured to indicate that a wafer is present on the endeffector.

The light receiver pathway further includes an orifice or light receiver opening 122. As shown in FIG. 7, the light beam being emitted by the light sending pathway has a tendency to spread out and have a conical shape as the light beam advances towards the light receiver pathway. By traveling in a cone pattern, the light may reflect off of neighboring surfaces. The reflected light can rebound to the detector providing for false readings.

The orifice 122, however, may eliminate this problem by narrowing the field of view in which light is received. In general, the orifice 122 provides a hood for the light receiver pathway. Thus, the orifice 122 inhibits incident light from being communicated to the light sensor via the light receiver pathway.

The diameter of the light receiver orifice 122 may vary depending upon the particular application. In one embodiment, for instance, the orifice may have a diameter of from about 1 mm to about 5 mm, such as by having a diameter of from about 2 mm to about 4 mm.

In the above range of parameters, the light beam that is focused across the endeffector of the present invention may have a diameter of from about 2 mm to about 4 mm. For example, in one embodiment, the light beam can have a wafer detection diameter of about 3 mm. In other words, in this embodiment, the light detection system is capable of detecting wafers in a Z range of about 3 mm. To reduce unintended ray reflection, for most applications, the light beam diameter should not be more than about 3 mm.

Referring now to FIGS. 8-12, an endeffector 34 for handling wafers at elevated temperatures is shown. In particular, the endeffector is well suited to handling wafers at temperatures greater than about 250° C., such as greater than about 500° C. The endeffector 34 includes a base member 124 comprising a back portion 126 connected to a first tine 128 and a second tine 130. In order to handle wafers at an elevated temperature, the tines 128 and 130 can be made from a heat resistant material, such as quartz or sapphire. Preferably, the tines 128 and 130 are polished to a smooth surface. For example, in one embodiment, the surface may be flame polished.

As shown, the endeffector 34 further includes a plurality of support members 132, 134, 136, and 138. The support members may be integral with the endeffector or may be made from separate pieces of material. The support members 132, 134, 136, and 138 can be made from the materials described above, such as quartz or sapphire.

Referring to FIG. 11, an expanded view of the support member 136 is shown, while in FIG. 12, an enlarged view of the support member 132 is shown. As illustrated, the support members 132 and 136 each have an arcuate shape. The arcuate shape is designed generally to match the radius of a semiconductor wafer to be held on the endeffector. Support member 136 further includes a sloping surface 140, while support member 132 includes a sloping surface 142. The sloping surfaces 140 and 142 are designed to only contact an edge of a semiconductor wafer. All of the support members together define a wafer capturing radius for positioning and holding wafers on the endeffector.

During wafer heating, it is known that semiconductor wafers may increase in diameter by greater than about 1 mm. In this regard, the sloping surface associated with each support member is also designed to handle wafers when the wafers are either relatively hot or relatively cold. In this regard, the sloping surface of each of the support members defines a first or maximum radius at the top of the support members and a second or minimum radius towards the bottom of the support members adjacent the base member of the endeffector. In accordance with the present invention, the difference between the maximum radius of the support members and the minimum radius of the support members is greater than about 0.5 mm, such as greater than about 1 mm.

In this manner, all of the support members operate together for handling wafers with different sizes. For example, referring to FIGS. 9A and 9B, a side view of the endeffector 34 is illustrated. In particular, FIGS. 9A and 9B show the support member 132 and the support member 138 holding a semiconductor wafer 144. In FIG. 9A, the semiconductor wafer 144 is at an elevated temperature and thus has a larger diameter than the wafer 144 shown in FIG. 9B. In accordance with the present invention, however, the support members 132 and 138 are capable of supporting the wafer either in its hot, expanded state or in a cooler state. Further, the support members are capable of holding the wafer only at the edge of the wafer.

As shown in FIGS. 9A and 9B, the sloping surface of the support members 132 and 138 has a concave shape. The sloping surface of the support members, however, may have other various shapes depending upon the particular application. For example, instead of being concave, the surface may also have a convex shape. Referring to FIGS. 10A and 10B, the sloping surface of the support members 132 and 138, in this embodiment, have a chamfered surface. More particularly, the surface of the support members is linear in this embodiment. A wafer 144 is shown held by the support surfaces similar to the manner shown in FIGS. 9A and 9B.

Referring back to FIG. 8, the endeffector 34 further includes a pair of emergency pins 146 and 148 similar to the emergency pins 76 and 78 as shown in FIG. 2. The emergency pins 146 and 148 are intended to contact a wafer that is either out of alignment or is bent or bowing when held on the endeffector. In fact, wafers at an elevated temperature may have more of a tendency to bow and contact the emergency pins 146 and 148. In general, the emergency pins 146 and 148 can be made from any heat resistant material, such as quartz or sapphire. The pins may be formed separately from the endeffector or may be integral with the endeffector. As described in FIG. 2, the emergency pins have a height less than the height of the support members and are not designed to contact a wafer unless the wafer is in fact bent or bowing.

Figure 8:
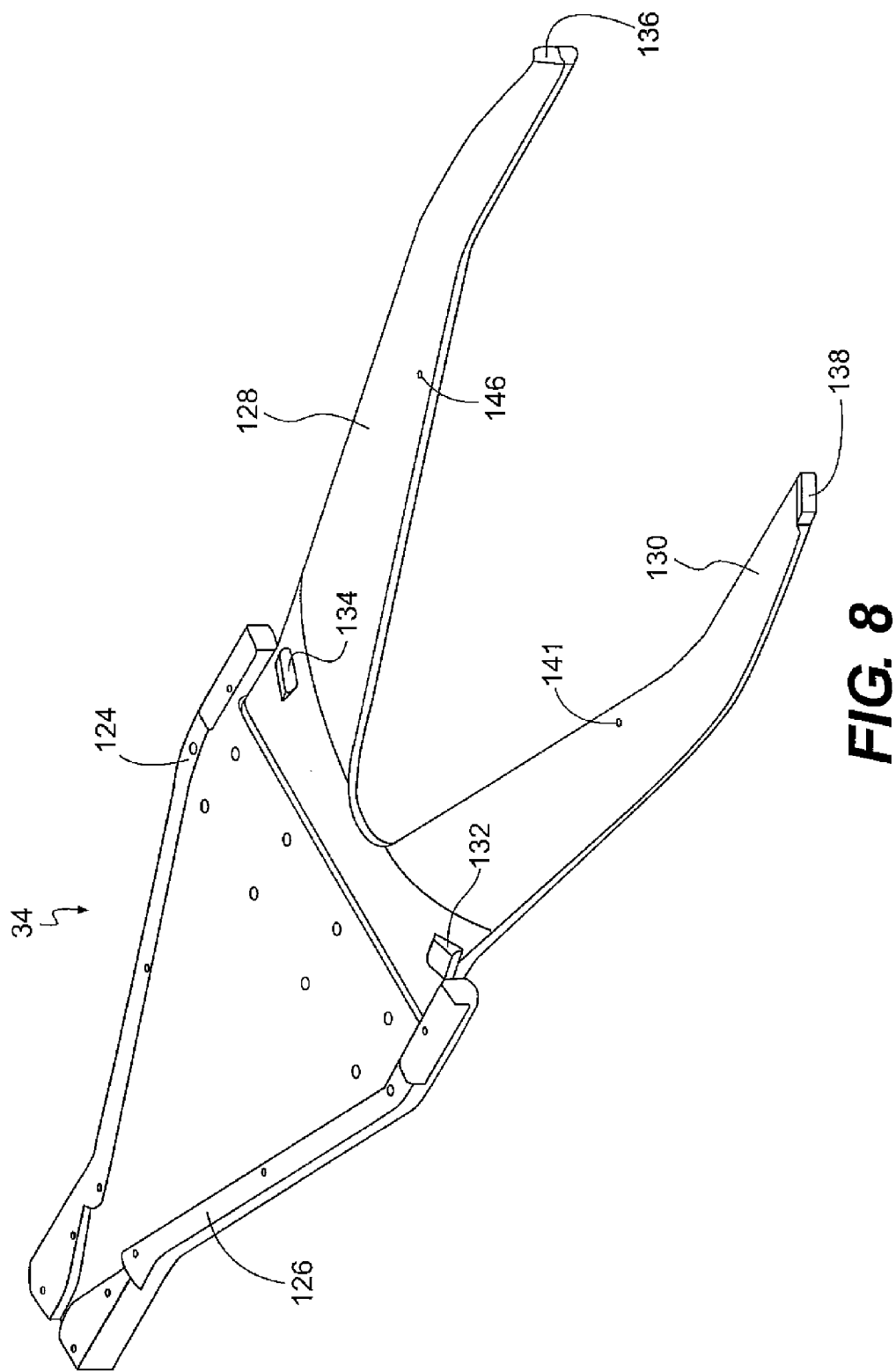
FIG. 8 is a perspective view of another embodiment of an endeffector made in accordance with the present invention.

The endeffector 34 as shown in FIG. 8 may include a wafer detection system such as the one illustrated in FIGS. 7, 7A and 7B. For most embodiments, when adapted to carry or handle wafers at an elevated temperature, the endeffector does not need a pushing device.

The endeffectors 32 and 34 as shown in the figures and as described above offer various advantages and benefits over many prior art constructions. For instance, as described above, the endeffectors have a slim profile and are easily maneuverable. The endeffectors also include uniquely shaped support members, a unique wafer detection system, and/or a pusher device that can be used to assist in loading wafers and clamping wafers to the endeffector. In fact, through the above combination of elements, it is believed that the endeffectors of the present invention may retrieve wafers more efficiently than many endeffectors made in the past.

For instance, the support members present on the endeffector are capable of actively gripping and centering wafers when wafers are placed on the endeffector. Thus, clamping of the wafer using the pusher, for instance, need not be initiated until after the endeffector has retrieved a wafer and started moving. Not having to clamp the wafers immediately may greatly increase the throughput of the wafer processing system.

For example, in one embodiment, the endeffector of the present invention is moved into a wafer station where a wafer is positioned. The endeffector moves in below the wafer. Once below the wafer, the endeffector is lifted in the Z direction in order for the wafer to be placed on the endeffector. While the wafer is in an unclamped or undefined position, the wafer detection system then determines whether or not the wafer is present on the endeffector. If the wafer is present on the endeffector, the endeffector immediately moves out of the wafer station and while moving may center the wafer using, for instance, the pushing device.

As described above, when loading a wafer on the endeffector, the pushing device in its retracted position may also be used to push the wafer onto the tines of the endeffector.

In comparison to the above process, many prior art endeffectors require that the wafer be centered and clamped in the wafer station prior to retracting the endeffector from the station. The endeffectors of the present invention, due to their construction, overcome this disadvantage.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed:

1. An endeffector for handling semiconductor wafers comprising:
a base member having a proximal end and as distal end;
a plurality of support members located on the base member for contacting and supporting a wafer placed on the endeffector, the support members being configured to only contact an edge of as semiconductor wafer, the support members defining a wafer receiving area therebetween, the support members having an arcuate shape that generally matches a radius of a semiconductor wafer, each support member having a top surface, a bottom surface adjacent to the base member, and a curved wafer contact surface extending between the top surface and the bottom surface, wherein the curved wafer contact surface tapers from a maximum radius at the top surface to a minimum radius at the bottom surface, the difference between the maximum radius and the minimum radius being at least about 0.75 nm.

2. An endeffector as defined in claim 1, wherein the support members are made from a material capable of withstanding temperatures of up to at least about 750° C.

3. An endeffector as defined in claim 1, wherein the base member including the support members are made from a crystalline material.

4. An endeffector as defined in claim 3, wherein the support members are integral with the base member.

5. An endeffector as defined in claim 3, wherein the crystalline, material comprises quartz.

6. An endeffector as defined in claim 5, wherein the quartz is flame polished.

7. An endeffector as defined in claim 1, wherein the curved wafer contact surfaces of the support members have a convex shape.

8. An endeffector as defined in claim 1, wherein the curved wafer contact surfaces of the support members have a concave shape.

9. An endeffector as defined in claim 1, wherein the endeffector has a maximum profile height of less than about 12 mm.

10. An endeffector as defined in claim 1, wherein the endeffector has a maximum profile height of less than about 10 mm.

11. An endeffector as defined in claim 1, wherein the base member includes a first tine spaced from a second tine, each of the tines including a terminal end defining the distal end of the base member, and wherein a support member is located at the terminal end of each of the tines.

12. An endeffector as defined in claim 11, wherein the endeffector includes at least four support members.

13. An endeffector as defined in claim 12, wherein the endeffector includes at least two support members positioned at the proximal end of the base member.

14. An endeffector as defined in claim 1, wherein the plurality of support members define a wafer receiving area and wherein the endeffector further comprises a pair of emergency pins located across from each other on the base member generally in a center area of the wafer receiving area between the proximal end and the distal end of the base member, the emergency pins having a height that is below the height of the support members, the emergency pins for preventing a semiconductor wafer from contacting the base member.

15. An endeffector as defined in claim 1, wherein at least one support member is located near the proximal end and at least one support member is located near the distal end.

\* \* \* \* \*